United States Patent [19]
Nuckols

[11] Patent Number: 5,578,953
[45] Date of Patent: Nov. 26, 1996

[54] SELF–RESETTING STATUS REGISTER

[75] Inventor: Jeffrey R. Nuckols, Indialantic, Fla.

[73] Assignee: AirNet Communications Corporation, Melbourne, Fla.

[21] Appl. No.: 532,427

[22] Filed: Sep. 22, 1995

[51] Int. Cl.[6] ............................................. H03K 3/037
[52] U.S. Cl. ........................ 327/215; 327/198; 327/218
[58] Field of Search .................................. 327/215, 218, 327/198

[56] References Cited

U.S. PATENT DOCUMENTS 5,038,059  8/1991  Ebzery et al. ........................ 327/198

5,493,242  2/1996  Simmons et al. ..................... 327/198

OTHER PUBLICATIONS

*Motorola Microprocessors Data Manual*, Technical Information Center, Motorola Inc., 1981.

*Primary Examiner*—Margaret Rose Wambach
*Attorney, Agent, or Firm*—Cesari and McKenna

[57] ABSTRACT

A self-resetting status register has two flip-flops per status bit to provide a stable output signal while the register is being read and to recognize event signals that are applied to the register during the read operation.

9 Claims, 2 Drawing Sheets

SELF-RESETTING STATUS REGISTER

FIELD OF THE INVENTION

This invention relates to microprocessor interface circuits and, more particularly, to status registers.

BACKGROUND OF THE INVENTION

Microprocessor-based control systems rely on interrupt signals from peripheral devices ("peripherals") to notify a central processing unit ("CPU") when specific events occur. These events include expected events, such as completed operations, as well as unexpected events, such as errors. A typical peripheral can detect several kinds of events and the total number of events that can be detected by all the peripherals of a system is generally larger than the number of unique interrupt signals that a CPU can recognize, so generally each peripheral is allocated only one of these unique interrupt signals and each peripheral has a status register by which it indicates to the CPU one or more reasons for an interrupt signal. Each bit in the status register corresponds to an event that the device can detect and the setting of any combination of status bits in the status register generates one interrupt signal. When the CPU services an interrupt signal it reads the status bits in the interrupting device's status register to ascertain which event(s) occurred and then it resets the status bits to signify to the peripheral that it has serviced the event(s) and to enable the peripheral to post a subsequent event.

Requiring the CPU to perform separate read and reset (write) operations on the status register increases the time it takes the CPU to service an interrupt signal and, therefore, delays the servicing of interrupt signals from other peripherals, possibly beyond their maximum wait ("latency") time. Designers of prior-art circuits, such as the Motorola MC6821 Peripheral Interface Adapter, reduce the time to service an interrupt signal by providing self-resetting registers, which automatically reset all their bits upon being read. However, and quite problematically, if a new event occurs while the CPU is reading such a status register, the associated peripheral does not generate a corresponding interrupt signal because at the end of the read operation the register resets itself, including the bit that corresponds to the new event.

SUMMARY OF THE INVENTION

The invention is a self-resetting status register that recognizes events that occur while the register is being read. During a read operation the register provides a stable output signal, i.e., none of the status bits changes states during a read operation, and after the read operation the register resets to a "ZERO" state those bits that were in a "ONE" state before the read operation began. During the read operation circuitry within the register records events that would otherwise change the states of any of the bits from a ZERO to a ONE and after the read operation it sets those bits to the ONE state.

The status register thus ensures that no event occurring during a read operation, i.e., while the CPU services a "current interrupt," goes unserviced by the CPU. If the status bit corresponding to the event is not set prior to the read operation, the register sets the bit after the read operation, which causes a subsequent interrupt. The CPU then services the event in response to the subsequent interrupt signal. On the other hand, if the status bit is already set before the beginning of the read operation, the CPU services the event as part of the current interrupt and then the register resets the status bit at the end of the read operation.

BRIEF DESCRIPTION OF THE DRAWINGS

The above and further advantages of the invention may be better understood by referring to the following description in conjunction with the accompanying drawings, in which.

DESCRIPTION OF THE PREFERRED EMBODIMENT

Figure 1:
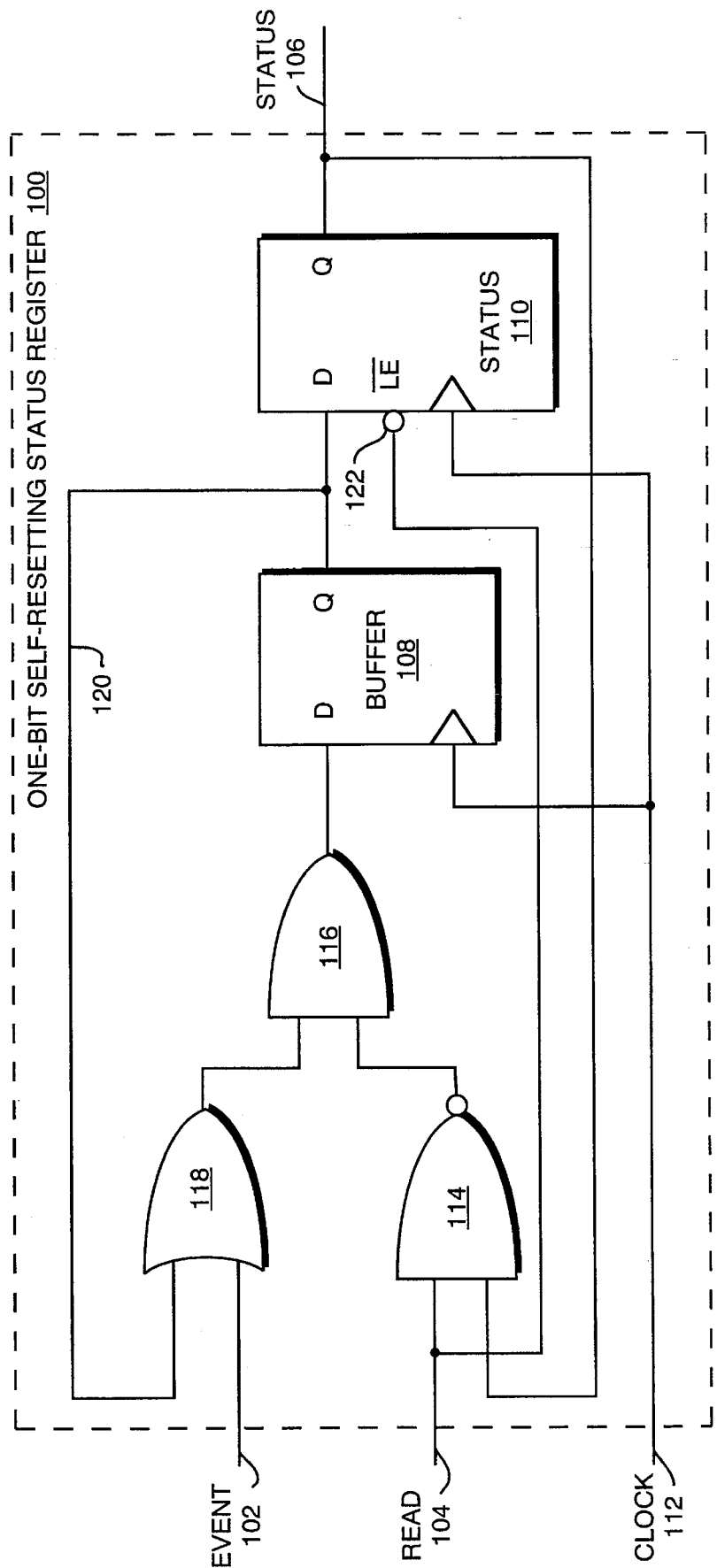
FIG. 1 is a schematic diagram of a one-bit, self-resetting status register according to the present invention.

A one-bit self-resetting status register 100, shown schematically in FIG. 1, is set, e.g. by a peripheral (not shown), by applying an event signal 102 to the register, and it is read, e.g. by a CPU (not shown), that applies a read signal 104 to the register while sensing a status signal 106 produced by the register. A buffer flip-flop 108 and a status flip-flop 110 are connected to a source of periodic clock pulses 112 and, being edge-triggered flip-flops, they change states only on the leading edges of clock pulses. Both flip-flops 108 and 110 are reset, i.e., set to the ZERO state, by an initialization circuit (not shown) when power is first applied to the status register 100.

An event occurring within the peripheral generates the event signal 102 for at least the period of the clock pulses 112. Assuming either that the status flip-flop 110 is in the ZERO state or that no read signal 104 is present, a NAND-gate 114 produces a resulting ONE signal, which enables an AND-gate 116. The event signal 102 thus passes through an OR-gate 118 and the AND-gate 116 and then sets the buffer flip-flop 108 on the next clock pulse 112. On the succeeding clock pulse 112, a signal from the buffer flip-flop 108 sets the status flip-flop 110 to the ONE state. Once the buffer flip-flop 108 is set, a feed-back circuit 120 sends a ONE signal through the OR-gate 118 and the AND-gate 116 to set the buffer flip-flop 108 on each succeeding clock pulse 112, as long as no read signal 104 is present. Thus, once set, the buffer flip-flop 108 remains set until a read signal 104 is applied to the register 100.

A CPU initiates a read operation of the status register 100 by applying the read signal 104 for at least the period of the clock pulses 112 and simultaneously sensing the status signal 106, which indicates the state of the status flip-flop 110. As long as the read signal 104 is present, the status flip-flop 110 is disabled from changing states by the read signal being present on a NOT-LOAD-ENABLE (LE) terminal 122 of the status flip-flop.

If the status flip-flop 110 is in the ONE state during the read signal 104, the NAND-gate 114 produces a ZERO signal, which disables the AND-gate 116. Regardless of whether the event signal 102 is present and despite the feed-back signal 120, the AND-gate 116 produces a ZERO signal, which resets the buffer flip-flop 108 on the next clock pulse 112. On the other hand, if the status flip-flop 110 is in the ZERO state during the read signal 104, the NAND-gate 114 produces a ONE signal, which enables the AND-gate 116. If the event signal 102 is present it passes through the OR-gate 118 and the AND-gate 116 and then sets the buffer flip-flop 108 on the next clock pulse 112. In either case, on the succeeding clock pulse 112 a signal from the buffer flip-flop 108 sets the status flip-flop 110 to the same state as the buffer flip-flop. Thus, after being read, the status register 100 resets itself if it is in the ONE state prior to the read operation, but the occurrence of the event signal 102 during a read operation sets the register if the register is in the ZERO state prior to the read operation.

Figure 2:
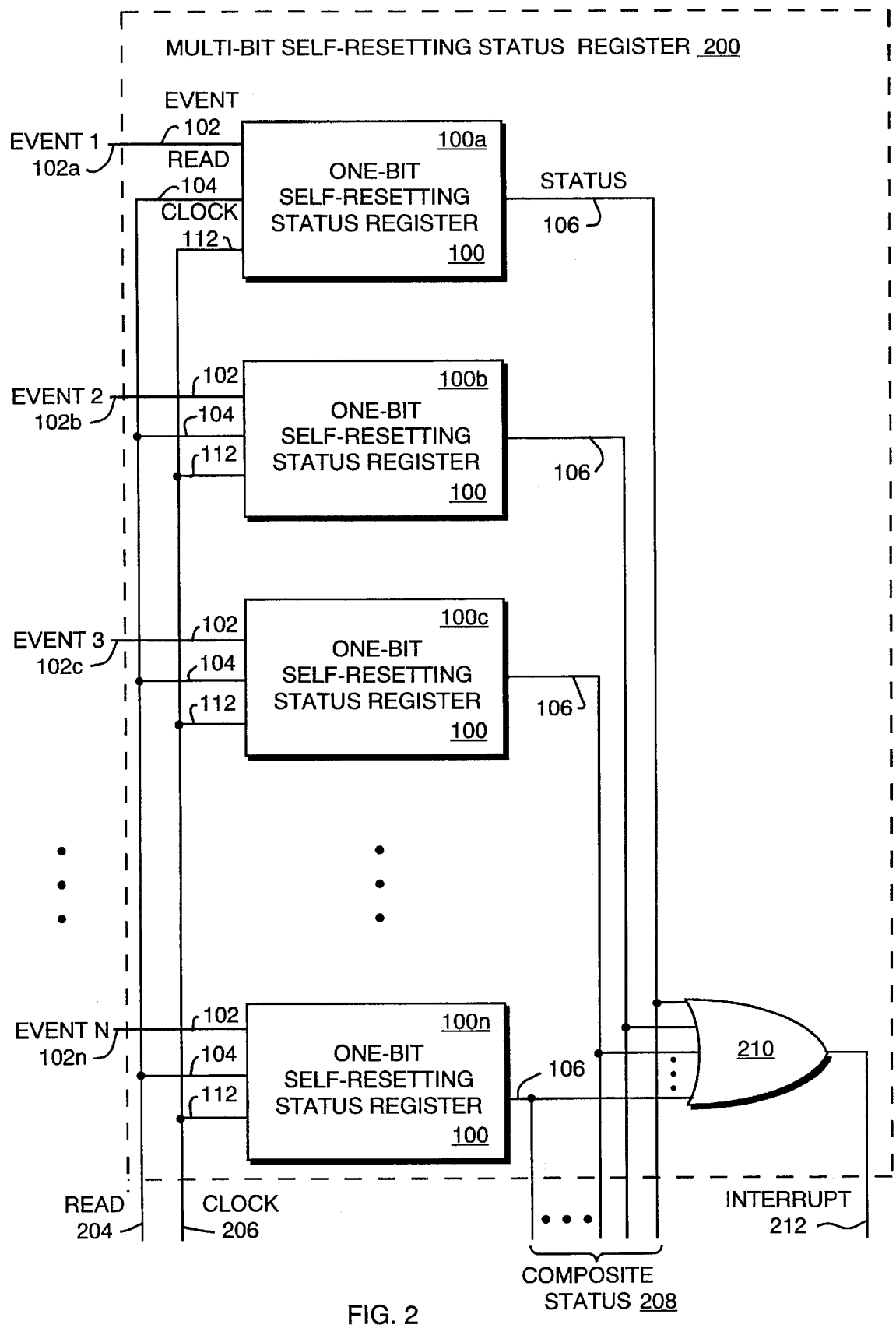
FIG. 2 is a schematic diagram of a multi-bit, self-resetting status register, which utilizes the one-bit status register of FIG. 1.

FIG. 2 shows a multi-bit, self resetting status register 200 that employs the one-bit, self-resetting status register 100 of FIG. 1 for each bit 100a, b, c . . . , n of the status register. Such a multi-bit status register can be used by a peripheral (not shown) that can detect more than one event. Event signals 102a, b, c, . . . , n set the respective bits 100a, b, c, . . . , n, as described above. A read signal 204 and a source of periodic clock pulses 206 supply, respectively, the read signal 104 and clock pulses 112 to each one-bit register 100a, b, c, . . . , n.

If the status signal 106 from any of the one-bit registers 100a, b, c, . . . , n is a ONE, an OR-gate 210 produces an interrupt signal 212, which interrupts a CPU (not shown). Collectively, the status signals 106 from the one-bit registers 100a, b, c, . . . , n provide a multi-bit, composite status signal 208. When the CPU services the interrupt signal and generates the read signal 204, it reads the composite status signal 208, thereby reading the state of each status bit. Each one-bit register 100a, b, c, . . . , n then resets itself if it is in the ONE state, but the one-bit registers that are in the ZERO state before the read operation recognize event signals that occur during the read operation.

It will therefore be seen that I have developed a self-resetting status register that recognizes event signals that occur while the register is being read, which can be utilized with a variety of peripherals and controllers. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed. For example, those skilled in the art will recognize that although the circuits of FIGS. 1 and 2 are described as utilizing signals, such as the event signal 102, that are asserted on TRUE, i.e., on a HIGH logic level, some or all of the signals can be asserted on FALSE with only minor modifications to the circuits. NAND-gate 114, AND-gate 116 and OR-gate 118, constitute a gating arrangement, but other arrangements of components can be substituted therefor without departing from the scope of the invention. Furthermore, buffer flip-flop 108 and status flip-flop 110 are D-type flip-flops in the preferred embodiment, but other types of memories, such as J-K flip-flops, can be used.

What is claimed is:

1. A status register:
   (A) comprising:
      (i) a buffer memory having a zero state and a one state;
      (ii) a status memory having a zero state and a one state and being capable of being disabled from changing states;
      (iii) means for, at least occasionally, setting the status memory to the same state as the buffer memory unless the status memory is disabled;
      (iv) a first terminal coupled to the status memory for providing a status signal indicating the state of the status memory;
      (v) a second terminal for receiving a read signal;
      (vi) a third terminal for receiving an event signal;
      (vii) a gating arrangement coupled to the buffer memory for:
         (a) responsive to the event signal, setting the buffer memory to the one state unless the read signal is received during the event signal when the status memory is in the one state, and
         (b) responsive to the read signal, setting the buffer memory to the zero state when the status memory is in the one state, whereby after a read signal, the buffer memory is in the zero state unless the event signal is received during the read signal when the status memory is in the zero state; and
   (B) wherein the read signal disables the status memory, whereby the state of the status memory does not change for at least the duration of the read signal even if the state of the buffer memory changes during the read signal, but if the state of the buffer memory changes during the read signal the state of the status memory subsequently reflects the changed state of the buffer memory.

2. The status register defined in claim 1, wherein the buffer memory comprises a first flip-flop and the status memory comprises a second flip-flop.

3. The status register defined in claim 2, wherein:
   (A) the first flip-flop and the second flip-flop each has an input terminal and an output terminal, the output terminal of the first flip-flop being coupled to the input terminal of the second flip-flop and the output terminal of the second flip-flop being coupled to the first terminal of the status register for providing a status signal;
   (B) the second flip-flop has a NOT-LOAD-ENABLE input terminal coupled to the second terminal of the status register for receiving a read signal; and
   (C) the gating arrangement comprises:
      (i) an OR-gate having first and second input terminals and an output terminal, the first input terminal of the OR-gate being coupled to the third terminal of the status register for receiving an event signal and the second input terminal of the OR-gate being coupled to the output terminal of the first flip-flop;
      (ii) a NAND-gate having first and second input terminals and an output terminal, the first input terminal of the NAND-gate being coupled to the output terminal of the second flip-flop and the second input terminal of the NAND-gate being coupled to the second terminal of the status register for receiving a read signal; and
      (iii) an AND-gate having first and second input terminals and an output terminal, the first input terminal of the AND-gate being coupled to the output terminal of the OR-gate, the second input terminal of the AND-gate being coupled to the output terminal of the NAND-gate and the output terminal of the AND-gate being coupled to the input terminal of the first flip-flop.

4. The status register defined in claim 3, wherein the first flip-flop and the second flip-flop each has a clock input terminal coupled to a source of periodic clock pulses.

5. A multi-bit status register:
   (A) comprising:
      (i) a plurality of first terminals for receiving an event signal;
      (ii) a buffer memory associated with each first terminal, the buffer memory having a zero state and a one state;
      (iii) a status memory associated with each buffer memory, the status memory having a zero state and a one state and being capable of being disabled from changing states;
      (iv) means for, at least occasionally, setting each status memory to the same state as the associated buffer memory unless the status memory is disabled;

(v) a second terminal coupled to the status memories for providing a composite status signal indicating the states of the status memories;

(vi) a third terminal for receiving a read signal;

(vii) a gating arrangement coupled to each buffer memory for:

(a) responsive to the event signal received over the associated first terminal, setting the buffer memory to the one state unless the read signal is received during the event signal when the associated status memory is in the one state, and (b) responsive to the read signal, setting the buffer memory to the zero state when the associated status memory is in the one state, whereby after a read signal the buffer memory is in the zero state unless the event signal received over the associated first terminal is received during the read signal when the status memory is in the zero state; and (B) wherein the read signal disables the status memories, whereby the states of the status memories do not change for at least the duration of the read signal even if the states of one or more of the buffer memories change during the read signal, but if the states of one or more of the buffer memories changes during the read signal the state of the associated status memories subsequently reflect the changed states of the buffer memories.

6. The multi-bit status register defined in claim 5, further comprising:

(C) a fourth terminal for providing an interrupt signal when at least one of the status memories is in the one state.

7. The multi-bit status register defined in claim 6, wherein each buffer memory comprises a first flip-flop and each status memory comprises a second flip-flop.

8. The multi-bit status register defined in claim 7, wherein:

(a) each first flip-flop and each second flip-flop has an input terminal and an output terminal, the output terminal of each first flip-flop being coupled to the input terminal of the associated second flip-flop and the output terminal of each second flip-flop being coupled to the second terminal of the multi-bit status register for providing a composite status signal;

(b) each second flip-flop has a NOT-LOAD ENABLE input terminal coupled to the third terminal of the multi-bit status register for receiving a read signal; and (c) the gating arrangement comprises:

(i) an OR-gate associated with each first flip-flop, each OR-gate having first and second input terminals and an output terminal, the first input terminal of each OR-gate being coupled to the associated first terminal of the multi-bit status register for receiving an event signal and the second input terminal of each OR-gate being coupled to the output terminal of the associated first flip-flop;

(ii) a NAND-gate associated with each second flip-flop, each NAND-gate having first and second input terminals and an output terminal, the first input terminal of each NAND-gate being coupled to the output terminal of the associated second flip-flop and the second input terminal of each NAND-gate being coupled to the third terminal of the multi-bit status register for receiving a read signal; and (iii) an AND-gate associated with each first flip-flop, each AND-gate having first and second input terminals and an output terminal, the first input terminal of each AND-gate being coupled to the output terminal of the associated OR-gate, the second input terminal of each AND-gate being coupled to the output terminal of the associated NAND-gate and the output terminal of each AND-gate being coupled to the input terminal of the associated first flip-flop.

9. The multi-bit status register defined in claim 8, wherein each first flip-flop and each second flip-flop has a clock input terminal coupled to a source of periodic clock pulses.

* * * * *